(12) United States Patent
Kervran et al.

(10) Patent No.: US 12,368,997 B2
(45) Date of Patent: Jul. 22, 2025

(54) MICROELECTROMECHANICAL SYSTEM MEMBRANE

(71) Applicant: AAC Technologies Pte. Ltd., Singapore (SG)

(72) Inventors: Yannick Pierre Kervran, HK (FR); Scott Lyall Cargill, EB (GB)

(73) Assignee: AAC Technologies Pte. Ltd., Singapore (SG)

( * ) Notice: Subject to any disclaimer, the term of this patent is extended or adjusted under 35 U.S.C. 154(b) by 179 days.

(21) Appl. No.: 18/472,204

(22) Filed: Sep. 21, 2023

(65) Prior Publication Data
US 2025/0106561 A1 Mar. 27, 2025

(51) Int. Cl.
*H04R 7/10* (2006.01)
*B81B 3/00* (2006.01)
*H04R 19/04* (2006.01)

(52) U.S. Cl.
CPC .............. *H04R 7/10* (2013.01); *B81B 3/0072* (2013.01); *H04R 19/04* (2013.01); *B81B 2201/0257* (2013.01); *B81B 2203/0127* (2013.01); *B81B 2203/019* (2013.01); *B81B 2203/04* (2013.01); *H04R 2201/003* (2013.01)

(58) Field of Classification Search
CPC .................. B81B 3/0072; B81B 3/007; B81B 2201/0257; B81B 2203/0127; B81B 3/0021; H04R 7/14; H04R 2201/003; H04R 2410/03; H04R 7/02; H04R 19/005; H04R 7/06; H04R 1/08; H04R 7/16
See application file for complete search history.

(56) References Cited

U.S. PATENT DOCUMENTS

| | | | | |
|---|---|---|---|---|
| 9,181,080 B2* | 11/2015 | Dehe | ........................ | H04R 7/02 |
| 9,438,979 B2* | 9/2016 | Dehe | ..................... | H04R 19/04 |
| 11,405,731 B1* | 8/2022 | Boyd | .................... | B81B 3/0021 |
| 11,765,509 B1* | 9/2023 | Boyd | ....................... | H04R 1/08 |
| | | | | 381/398 |
| 2018/0234774 A1* | 8/2018 | Walther | ............... | H04R 19/005 |
| 2023/0331543 A1* | 10/2023 | Kervran | ................. | B81B 3/007 |

* cited by examiner

*Primary Examiner* — Angelica M McKinney
(74) *Attorney, Agent, or Firm* — Wiersch Law Group

(57) ABSTRACT

A microelectromechanical system membrane includes spacers, counter electrodes, a first diaphragm and a second diaphragm. The spacers and the counter electrodes are at the same level and arranged alternatively on cross sections of the microelectromechanical system membrane. The first diaphragm and the second diaphragm are respectively located on opposite sides of the spacers and hermetically connected. The first diaphragm is provided with first projections spaced arranged in the first direction, and the second diaphragm is provided with second projections spaced arranged alternately in the first direction. The first projections include first front walls and first back walls disposed opposite in the first direction, and the second projections include second front walls and second back walls disposed opposite in the first direction. At least some of the first front and back walls, the second front and back walls are configured to be sub-corrugation structures. The microelectromechanical system membrane has an improved robustness.

20 Claims, 2 Drawing Sheets

MICROELECTROMECHANICAL SYSTEM MEMBRANE

TECHNICAL FIELD

The present disclosure relates to the field of electro-acoustic conversion devices, and in particular, to a microelectromechanical system membrane and an electro-acoustic conversion device including the microelectromechanical system membrane.

BACKGROUND

In the field of MEMS microphones, some structures may be designed with a sealed cavity enclosed by two corrugation diaphragms, where the sealed cavity presents a reduced atmosphere and where a backplate is present and acts as counter electrode to form a capacitive differential sensing system.

When subjected to high pressures (from drops or air blows—in the order of 1 MPa), the dual-diaphragm structure is accordingly subjected to high displacements upwards or downwards (in the order of tens of micrometers). At such high displacements, localized high stresses appear and can be harmful for the structure with the creation of cracks in the materials and eventually result in a broken microphone.

Therefore, it is desired to provide an improved microelectromechanical system membrane which can overcome at least one of the above problems.

SUMMARY

To address the above problems, in one aspect, the present disclosure provides a microelectromechanical system membrane including:
- a plurality of spacers arranged in a first direction;
- a plurality of counter electrodes arranged in the first direction;
- a plurality of slots, each of the plurality of slots being formed between adjacent spacers and counter electrodes;
- a first diaphragm provided with a plurality of first projections spaced arranged in the first direction;
- a second diaphragm provided with a plurality of second projections spaced arranged in the first direction, the second projections extending in a direction away from the first projections;
- the plurality of spacers and the plurality of counter electrodes being at a same level and arranged alternatively on cross sections of the microelectromechanical system membrane;
- the first diaphragm and the second diaphragm being respectively located on opposite sides of the plurality of spacers and hermetically connected.
- the first projections being respectively aligned with the second projections to form chambers, and the plurality of counter electrodes being suspended within the chambers.
- portions between two adjacent first projections being first segments, portions between two adjacent second projections being second segments, the first segments being respectively aligned with the second segments, and the spacers being sandwiched therein.
- the first projections including first front walls and first back walls disposed opposite in the first direction, and the second projections including second front walls and second back walls disposed opposite in the first direction; and at least some of the first front walls, the first back walls, the second front walls, and the second back walls being configured to be sub-corrugation structures.

In some embodiments, the first front walls and the first back walls adjacent to the first segments connected to the spacers at an edge of the first diaphragm are configured to be sub-corrugation structures. And the second front walls and the second back walls adjacent to the second segments connected to the spacers at an edge of the second diaphragm are also configured to be sub-corrugation structures.

In some embodiments, the first front and back walls adjacent to the first segments connected to spacers at outermost or $2^{nd}$ outermost rings of the first diaphragm are configured to be sub-corrugation structures. And the second front and back walls adjacent to the second segments connected to spacers at outermost or $2^{nd}$ outermost rings of the second diaphragm are configured to be sub-corrugation structures.

In some embodiments, the first front and back walls adjacent to the first segments connected to spacers at outermost 2 or 3 rings of the first diaphragm are configured to be sub-corrugation structures. And the second front and back walls adjacent to the second segments connected to spacers at outermost 2 or 3 rings of the second diaphragm are configured to be sub-corrugation structures.

In some embodiments, the first front and back walls adjacent to the first segments connected to all the spacers of the first diaphragm are configured to be sub-corrugation structures. And the second front and back walls adjacent to the second segments connected to all the spacers of the second diaphragm are configured to be sub-corrugation structures.

In some embodiments, the sub-corrugation structures include third crests and third troughs connected to each other in the first direction, the third crests are respectively connected to the first segments and the second segments, and the third troughs are respectively connected to tops of the first projections and the second projections.

In some embodiments, tops of the third crests and bottoms of the third troughs are conical or flat.

In some embodiments, the tops of the third crest are not higher than the tops of the first projections and the second projections.

In some embodiments, the bottoms of the third troughs are not lower than heights of the first segments and the second segments.

In some embodiments, the sub-corrugation structures have a length in the first direction that is less than a length of the first projections, the second projections, the first segments, or the second segments.

In some embodiments, the sub-corrugation structures are formed integrally with the first diaphragm or the second diaphragm.

In some embodiments, the first projections have the same shape and size as the second projections, and the first segments have the same length as the second segments.

In some embodiments, tops of the first projections and the second projections are flat, the first segments and the second segments are also flat.

In some embodiments, the chambers are hermetically sealed, with an inside pressure less than an external atmosphere.

In some embodiments, the chambers are under vacuum.

In some embodiments, the first direction is a radial or transverse direction.

In some embodiments, the first and second diaphragms are made of conductive materials or include an insulating film with a conductive element disposed thereon.

In some embodiments, the first and second diaphragms further each includes a plurality of spokes, the spokes dividing the first and second diaphragms into several sections in a circumferential direction.

In some embodiments, at least a part of the counter electrodes is suspended between but not in contact with the sub-corrugation structures of the first diaphragm and corresponding sub-corrugation structures of the second diaphragm.

The present disclosure has following advantages in comparison with existing technologies.

By designing at least some of the first front walls, the first back walls, the second front walls, and the second back walls to be configured as sub-corrugation structures, and due to an additional bending freedom of the sub-corrugation structures, which allowing the sub-corrugation structures have a different deformation than the double diaphragms structure and to release stresses through the deformation. Therefore, the sub-corrugation structures can share the stress at the bevels where the first projections and the second projections connected to the respective diaphragm, thereby ultimately reducing the maximum stress on the diaphragms. Meanwhile, the microelectromechanical system membrane maintains an original stiffness of the first and second diaphragms, so that original performances are maintained, which greatly improves the robustness of the device, effectively reduces the maximum stress applied to the diaphragms under high pressure shock (drop or air blows), and ultimately improves the mechanical robustness of the device.

Additionally, the microelectromechanical system membrane of the present disclosure has a high level of acoustic compliance and sensitivity.

In another aspect, the present disclosure provides an electro-acoustic conversion device including the microelectromechanical system membrane described above, and a circuit device electrically connected to the microelectromechanical system membrane.

The electro-acoustic conversion device has the same advantages in comparison with the existing technologies as the microelectromechanical system membrane described above and will not be described herein.

BRIEF DESCRIPTION OF DRAWINGS

In order to explain technical solutions of embodiments of the present disclosure more clearly, accompanying drawings used to describe the embodiments are briefly introduced below. It is evident that the drawings in following description are only concerned with some embodiments of the present disclosure. For those skilled in the art, in a case where no inventive effort is made, other drawings may be obtained based on these drawings.

Figure 1:
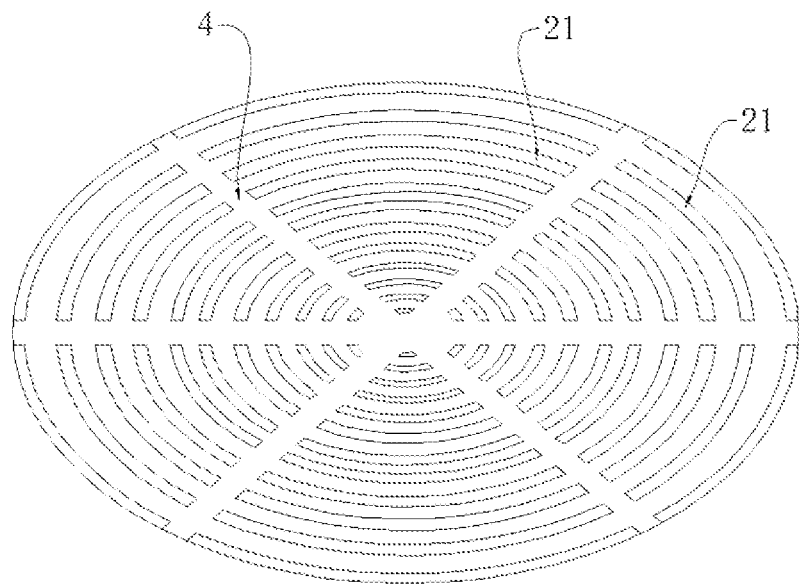
FIG. 1 illustrates a top view of a microelectromechanical system membrane comprising radial corrugations in accordance with some exemplary embodiments of the present disclosure.

Description of the drawings reference numbers are as follows. Herein the drawing reference numbers shall not be constructed as limiting the claims. 11, spacer; 12, counter electrode; 13, slot; 2, first diaphragm; 21, first projection; 22, first segment; 211, first front wall; 212, first back wall; 4, spoke; 3, second diaphragm; 31, second projection; 32, second segment; 311, second front wall; 312, second back wall; 41, chamber; 5, sub-corrugation structure; 51, third crest; 52, third trough.

DETAILED DESCRIPTION OF THE EMBODIMENTS

The present disclosure will be further illustrated with reference to the accompanying drawings. It shall be noted that the elements of similar structures or functions are represented by like reference numerals throughout the figures. The embodiments described herein are not intended as an exhaustive illustration or description of various other embodiments or as a limitation on the scope of the claims or the scope of some other embodiments that are apparent to one of ordinary skills in the art in view of the embodiments described in the present disclosure. In addition, an illustrated embodiment need not have all the aspects or advantages shown.

In the description of the present disclosure, it is to be understood that the terms "first", "second", or "third" etc. are used primarily to distinguish between different devices, elements or components (which may or may not be of the same specific type and construction) and are not intended to indicate or imply a relative importance and number of the devices, elements or components indicated. The term "plurality" means two or more.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Referring to FIG. 1 to FIG. 4, it illustrates a microelectromechanical system membrane according to some exemplary embodiments of the present disclosure. The microelectromechanical system membrane includes a plurality of spacers 11, a plurality of counter electrodes 12, a first diaphragm 2 and a second diaphragm 3. The plurality of spacers 11 and the plurality of counter electrodes 12 are arranged in a first direction, at the same level and arranged alternatively on cross sections of the microelectromechanical system membrane. There are slits between adjacent spacers 11 and counter electrodes 12 to form slots 13. The first diaphragm 2 and the second diaphragm 3 have similar corrugations, include a plurality of projections spaced arranged in the first direction, and the respective projections extend in opposite directions in a second direction. Further-more, the first diaphragm 2 and the second diaphragm 3 being respectively located on opposite sides of the spacers and hermetically connected. Herein the first direction is expressed as a radial or transverse direction, and the second direction is expressed as a vertical direction.

For a clearer description, the projections on the first diaphragm 2 may be referred to as the first projections 21, and the projections on the second diaphragm 3 may be referred to as the second projections 31. The first projections 21 and the second projections 31 may have the same shape and size. The shapes of the first projections 21 and the second projections 31 on the surface perpendicular to the first diaphragm 2 and the second diaphragm 3 (i.e., surface in the second direction) may be rectangular, trapezoidal or triangular etc.

Portions between two adjacent first projections 21 on the first diaphragm 2 is referred to as first segments 22 (i.e., portions on the first diaphragm 2 except the first projections 21), and portions between two adjacent second projections 31 on the second diaphragm 3 is referred to as second segments 32 (i.e., portions on the second diaphragm 3 except the second projections 31). The first segments 22 and the second segments 32 may have the same shape and size, for example, may be flat. Thus, the first segments 22 and the second segments 32 may have the same length.

The first projections 21 are respectively aligned with the second projections 31 to form chambers 41, and the counter electrodes 12 are suspended within the chambers 41. The first segments 22 are respectively aligned with the second segments 32 and connected by the spacers 11. In other words, one end of the spacers 11 is connected to the first segments 22, and the other end of the spacers 11 is connected to the second segments 32, i.e., the spacers 11 are sandwiched therein.

The spacers 11 may be, for example, pillars. The spacers 11 may be formed integrally with the first diaphragm 2 or the second diaphragm 3. Alternatively, the spacers 11 are formed between the first diaphragm 2 and the second diaphragm 3 after they are assembled together.

Preferably, the first diaphragm 2 and the second diaphragm 3 are corrugation conductive diaphragms, with the same shape and size, and are usually concentric circular structures. In some embodiments, the first diaphragm 2 and the second diaphragm 3 are divided into six equal sections in a circumferential direction, and adjacent sections are connected by a spoke 4 extending radially (i.e. in the first direction) along the diaphragms. In other words, the first and second diaphragms may further include a plurality of spokes 4. In some other embodiments, the first diaphragm 2 and the second diaphragm 3 may also have other shapes, such as square, hexagonal, octagonal, etc., without limitation herein.

In some embodiments, the first corrugation conductive diaphragm 2 and the second corrugation conductive diaphragm 3 may be made of electrically conductive materials or include an insulating membrane with electrically conductive elements provided thereon. For example, the first corrugation conductive diaphragm 2 and the second corrugation conductive diaphragm 3 include a Silicon Nitride membrane with PolySilicon electrodes formed on the surface of the diaphragms facing the counter electrodes 1 for providing conduction.

Figure 2:
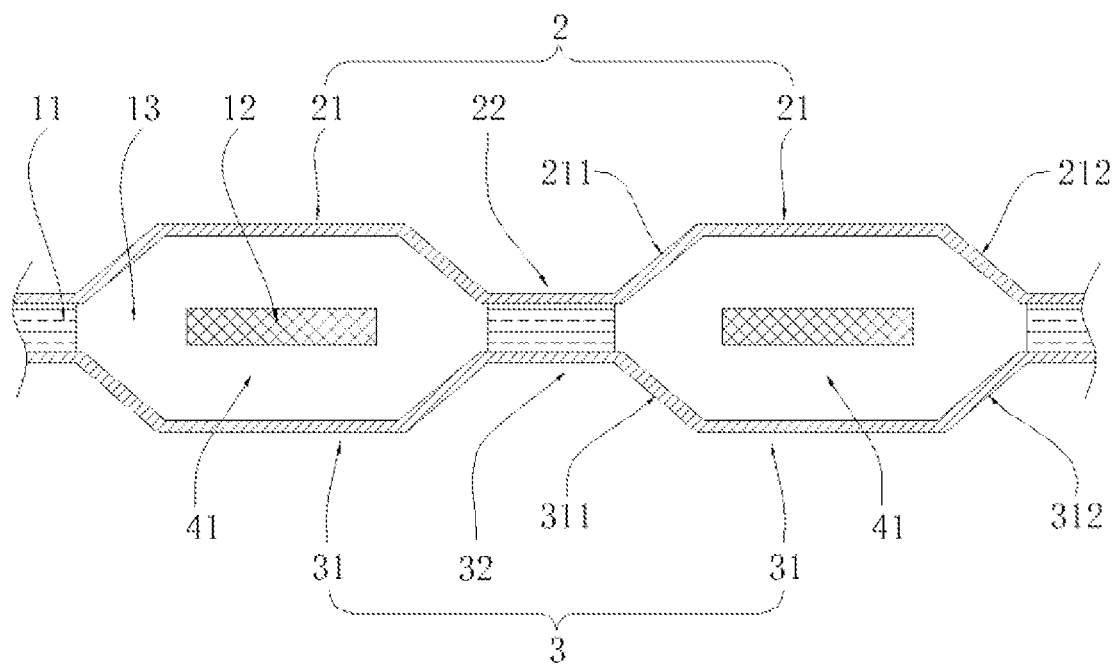
FIG. 2 is a cross-sectional view of a portion of the microelectromechanical system membrane of FIG. 1.
Figure 3:
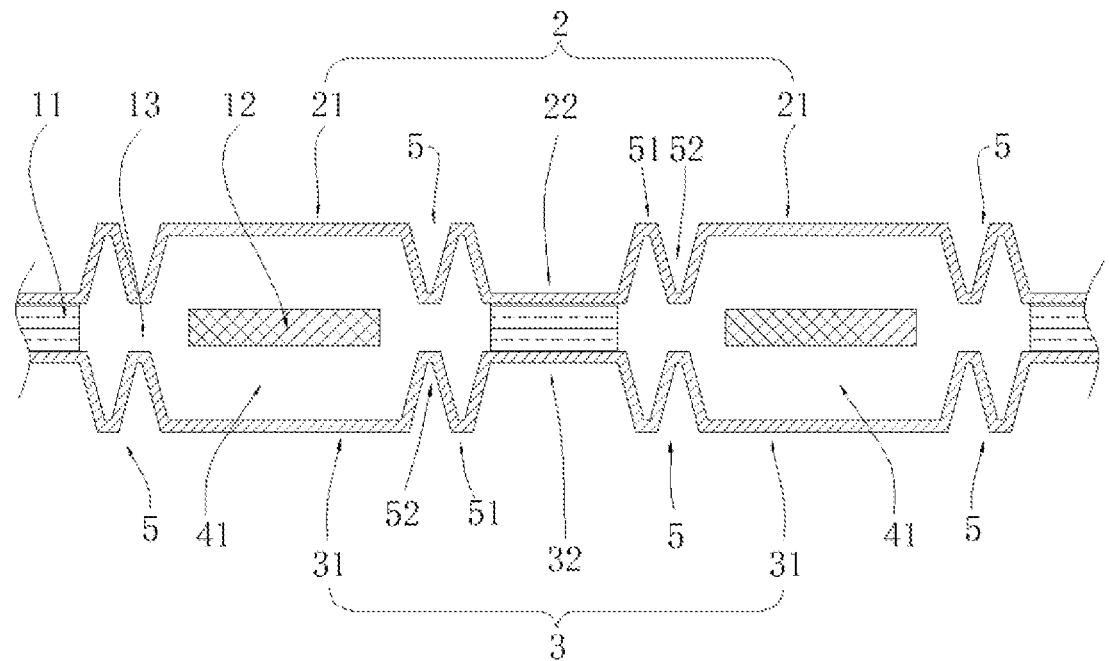
FIG. 3 is a cross-sectional view of a portion of the microelectromechanical system membrane with sub-corrugations in accordance with some other exemplary embodiments of the present disclosure.
Figure 4:
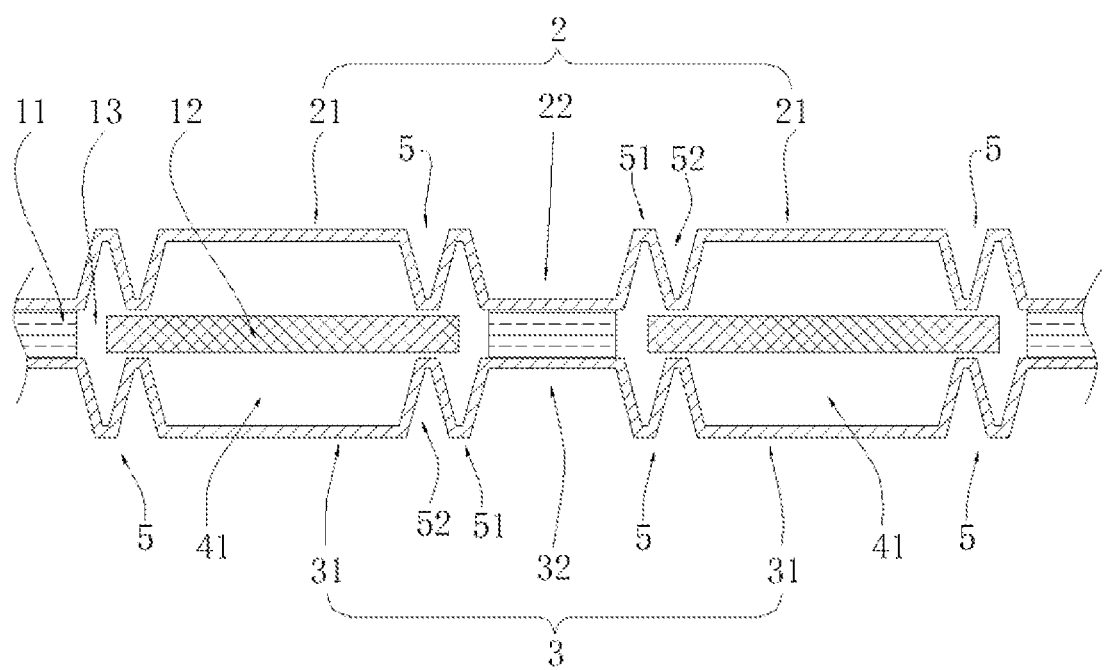
FIG. 4 is a cross-sectional view of a portion of the microelectromechanical system membrane with sub-corrugations in accordance with some other exemplary embodiments of the present disclosure.

Referring to FIG. 2 to FIG. 4, the first corrugated conductive diaphragm 2 includes a plurality of first projections 21 and the first segments arranged alternately in the first direction, the second corrugated conductive diaphragm 3 includes a plurality of second projections 31 and the second segments arranged alternately in the first direction. The second projections 31 are extending in a direction away from the first projections 21, and the second segments 32 are extending in a direction towards to the first segments 21. Since the first projections 21 and the second projections 31 have the same shape and size, the first portion 22 and the second segments 32 also have the same shape and size, thus the first corrugated conductive diaphragm 2 and the second corrugated conductive diaphragm 3 have the same length.

It should be noted that tops of the first projections 21 and the second projections 32, for example, but not limited to, are flat, as shown in FIG. 2 to FIG. 4. In some other embodiments, the tops of the first projections 21 and the second projections 32 may also be V-shaped, domed, or curved projections, without limitation herein.

The projections of the first diaphragm 2 and the second diaphragm 3 include front walls and back walls disposed opposite in the first direction. For a clearer description, the front walls and back walls of the first projections 21 may be referred to as the first front walls 211 and the first back walls 212, the front walls and back walls of the second projections 31 may be referred to as the second front walls 311 and the second back walls 312.

The first front walls 211, the first back walls 212, the second front walls 311, and the second back walls 312 may have a tilt angle greater than 0°, but less than or equal to 90°.

The bevels where the diaphragms are connected to the front walls and the back walls may experience localized high stresses when the structure is subjected to large displacements, which can cause damage to the double diaphragm structure. Therefore, in some embodiments, at least some of the front walls and the back walls are configured to be sub-corrugation structures 5. Specifically, as shown in FIG. 3 and FIG. 4, some of the first front walls 211, the first back walls 212, the second front walls 311, and the second back walls are configured to as sub-corrugation structures 5.

When the double diaphragm is subjected to large displacements, the sub-corrugation structures 5 can reduce localized stress through its own cushioning, thus effectively reducing the maximum stress applied to the double diaphragm under high pressure impact (from drops or air blows) and ultimately improving the mechanical robustness of the device.

When subjecting high pressures to the microelectromechanical system membrane (from drops or air blow, up to in the order of 1 MPa for example), bevels of the projections corresponding to the spacers at the outermost and $2^{nd}$ outermost of the diaphragms are subjected to the greatest stress. Therefore, in some preferred embodiments, the front walls and the back walls adjacent to the first and second segments connected to the spacers 11 at the outermost or $2^{nd}$ outermost ring of the first and second diaphragms are configured to be sub-corrugation structures 5, by such designs, the microelectromechanical system membrane can effectively reduce the maximum stress while maintaining the original performances.

In some embodiments, the front walls and the back walls adjacent to the first and second segments connected to the spacers 11 at the outermost 2 or 3 rings of the first and second diaphragms are configured to be sub-corrugation structures 5. In some embodiments, the front walls and the back walls adjacent to the first and second segments connected to all the spacers 11 of the first and second diaphragms are configured to be sub-corrugation structures 5.

Referring to FIG. 3 and FIG. 4, in order to maintain consistency in the radial or lateral extension of the diaphragms, in some embodiments, the sub-corrugation structures 5 are also arranged in the first direction. That is, the sub-corrugation structures 5 are arranged in the same direction as the first and second diaphragms. In some other embodiments, the sub-corrugation structures 5 may also be arranged at an angle to the first direction, such as 0° to 30°, etc., for example, along an original extension direction of the front walls or back walls as shown in FIG. 2, without limitation herein.

The sub-corrugation structures 5 include third crests 51 and third troughs 52 interconnected in the first direction, herein the third crests 51 extends in a direction away from the first and second diaphragms respectively, and the third troughs 52 extends to a direction towards to the first and second diaphragms respectively. Specifically, the third crests 51 are connected to the first segments 22 and the second segments 32 respectively, the third troughs 52 are connected to the tops of the first projections 21 and the second projections 31 respectively. Herein the connection means that two ends of the first segments 22 and the second segments 32 each is connected to one third crest 51, and the third troughs 52 are connected to the tops of the first projections 21 and the second projections 31, respectively.

A height of the third crests 51 is less than or equal to the heights of the first projections 21 and the second projections 31. In some embodiments, the height of the third crests 51 is the same as the heights of the first projections 21 and the second projections 31. The height described herein refers to the highest point.

Bottoms of the third troughs 52 are no lower than the heights of the first segments 22 and the second segments 32. In some embodiments, the bottoms of the third trough 52 are in the same plane as the first segments 22 and the second segments 32.

In some embodiments, the tops of the third crests 51, and the bottoms of the third troughs 52 may be tapered or flat.

In some embodiments, the length of the sub-corrugation structures 5 in the first direction is less than the length of the first projections 21, the second projections 31, the first segments 22, or the second segments 32. For example, including but not limited to, the length of the sub-corrugation structures 5 in the first direction may be ½, ⅓, ¼, ⅔, ¾, ⅖, ⅘, etc. of the length of the first projections 21, the second projections 31, the first segments 22, or the second segments 32.

In some embodiments, the sub-corrugation structures 5 may be integrally formed with the first diaphragm 2 and/or the second diaphragm 3.

Referring to FIG. 4, there are typically gaps between the sub-corrugation structures 5 at the front walls and the back walls of the first projections 21 and the second projections 31, and the counter electrodes 12 may be suspended within the gaps. That is, at least a portion of the counter electrodes 12 are disposed between the sub-corrugation structures 5 of the first diaphragm 2 and the second diaphragm 3, but is not in contact with the sub-corrugation structures 5.

The sub-corrugation structures 5 offer additional bending degrees of freedom to the spacer, allowing it to have a different deformation than the double diaphragm structure and to release stresses through this deformation. Thus the stresses at the bevels where the first projections 21 and the second projections 31 are connected to their respective diaphragms can be shared, thereby ultimately reducing the maximum stress on the diaphragms and greatly improving the robustness of the device. Meanwhile, the microelectromechanical system membrane has its original stiffness and original performance maintained.

In some other embodiments, an electro-acoustic conversion device is provided. The electro-acoustic conversion device includes the microelectromechanical system membrane described above and a circuit device electrically connected to the microelectromechanical system membrane. The electro-acoustic conversion device may be a microelectromechanical system membrane microphone or speaker.

Although the present disclosure is described with reference to one or more embodiments, the above description of the embodiments is used only to enable people skilled in the art to practice or use the present disclosure. It should be appreciated by those skilled in the art that various modifications are possible without departing from the spirit or scope of the present disclosure. The embodiments illustrated above should not be interpreted as limits to the present disclosure, and the scope of the present disclosure is to be determined by reference to the claims that follow.

What is claimed is:

1. A microelectromechanical system membrane comprising:
   a plurality of spacers arranged in a first direction;
   a plurality of counter electrodes arranged in the first direction;
   a plurality of slots, each of the plurality of slots being formed between adjacent spacers and counter electrodes;
   a first diaphragm provided with a plurality of first projections spaced arranged in the first direction; and
   a second diaphragm provided with a plurality of second projections spaced arranged alternately in the first direction, the second projections extending in a direction away from the first projections;
   wherein the plurality of spacers and the plurality of counter electrodes are at a same level and arranged alternatively on cross sections of the microelectromechanical system membrane;
   wherein the first diaphragm and the second diaphragm are respectively located on opposite sides of the plurality of spacers and hermetically connected;
   wherein the first projections are respectively aligned with the second projections to form chambers, and the plurality of counter electrodes are suspended within the chambers;
   wherein portions between two adjacent first projections are first segments, portions between two adjacent second projections are second segments, the first segments are respectively aligned with the second segments and the spacers are sandwiched therein;
   wherein the first projections comprise first front walls and first back walls disposed opposite in the first direction, and the second projections comprise second front walls and second back walls disposed opposite in the first direction; and
   at least some of the first front walls, the first back walls, the second front walls, and the second back walls are configured to be sub-corrugation structures.

2. The microelectromechanical system membrane according to claim 1, wherein the first front walls and the first back walls adjacent to the first segments connected to the spacers at an edge of the first diaphragm are configured to be sub-corrugation structures; and
   the second front walls and the second back walls adjacent to the second segments connected to the spacers at an edge of the second diaphragm are also configured to be sub-corrugation structures.

3. The microelectromechanical system membrane according to claim 1, wherein the first front and back walls adjacent to the first segments connected to spacers at outermost or $2^{nd}$ outermost rings of the first diaphragm are configured to be sub-corrugation structures; and the second front and back walls adjacent to the second segments connected to spacers at outermost or $2^{nd}$ outermost rings of the second diaphragm are configured to be sub-corrugation structures.

4. The microelectromechanical system membrane according to claim 1, wherein the first front and back walls adjacent to the first segments connected to spacers at outermost 2 or 3 rings of the first diaphragm are configured to be sub-corrugation structures; and the second front and back walls adjacent to the second segments connected to spacers at outermost 2 or 3 rings of the second diaphragm are configured to be sub-corrugation structures.

5. The microelectromechanical system membrane according to claim 1, wherein the first front and back walls adjacent to the first segments connected to all the spacers of the first diaphragm are configured to be sub-corrugation structures; and the second front and back walls adjacent to the second segments connected to all the spacers of the second diaphragm are configured to be sub-corrugation structures.

6. The microelectromechanical system membrane according to claim 1, wherein the sub-corrugation structures comprise third crests and third troughs connected to each other in the first direction, the third crests are respectively connected to the first segments and the second segments, and the third troughs are respectively connected to tops of the first projections and the second projections.

7. The microelectromechanical system membrane according to claim 6, wherein tops of the third crests and bottoms of the third troughs are conical or flat.

8. The microelectromechanical system membrane according to claim 7, wherein the tops of the third crest are not higher than the tops of the first projections and the second projections.

9. The microelectromechanical system membrane according to claim 7, wherein the bottoms of the third troughs is not lower than heights of the first segments and the second segments.

10. The microelectromechanical system membrane according to claim 1, wherein the sub-corrugation structures have a length in the first direction that less than a length of the first projections, the second projections, the first segments, or the second segments.

11. The microelectromechanical system membrane according to claim 1, wherein the sub-corrugation structures are formed integrally with the first diaphragm or the second diaphragm.

12. The microelectromechanical system membrane according to claim 1, wherein the first projections have the same shape and size as the second projections, the first segments have the same length as the second segments.

13. The microelectromechanical system membrane according to claim 1, wherein tops of the first projections and the second projections are flat, the first segments and the second segments are also flat.

14. The microelectromechanical system membrane according to claim 1, wherein the chambers are hermetically sealed, with an inside pressure less than an external atmosphere.

15. The microelectromechanical system membrane according to claim 1, wherein the chambers are under vacuum.

16. The microelectromechanical system membrane according to claim 1, wherein the first direction is a radial or transverse direction.

17. The microelectromechanical system membrane according to claim 1, wherein the first and second diaphragms are made of conductive materials or comprise an insulating film with a conductive element disposed thereon.

18. The microelectromechanical system membrane according to claim 1, wherein the first and second diaphragms further each comprises a plurality of spokes, the spokes dividing the first and second diaphragms into several sections in a circumferential direction.

19. The microelectromechanical system membrane according to claim 1, wherein at least a part of the counter electrodes is suspended between but not in contact with the sub-corrugation structures of the first diaphragm and corresponding sub-corrugation structures of the second diaphragm.

20. An electro-acoustic conversion device comprising the microelectromechanical system membrane according to claim 1, and a circuit device electrically connected to the microelectromechanical system membrane.

* * * * *